United States Patent
Shim et al.

(10) Patent No.: US 8,779,570 B2
(45) Date of Patent: Jul. 15, 2014

(54) STACKABLE INTEGRATED CIRCUIT PACKAGE SYSTEM

(75) Inventors: Seong Bo Shim, Icheon (KR); TaeWoo Kang, Suwon-si (KR); Yong Hee Kang, Icheon (KR)

(73) Assignee: STATS ChipPAC Ltd., Singapore (SG)

( * ) Notice: Subject to any disclaimer, the term of this patent is extended or adjusted under 35 U.S.C. 154(b) by 724 days.

(21) Appl. No.: 12/051,469

(22) Filed: Mar. 19, 2008

(65) Prior Publication Data

US 2009/0236731 A1 Sep. 24, 2009

(51) Int. Cl.
| | |
|---|---|
| H01L 23/02 | (2006.01) |
| H01L 23/12 | (2006.01) |
| H01L 23/34 | (2006.01) |
| H01L 23/48 | (2006.01) |
| H01L 23/52 | (2006.01) |
| H01L 23/40 | (2006.01) |
| H01L 23/28 | (2006.01) |
| H01L 21/00 | (2006.01) |

(52) U.S. Cl.
USPC ........... 257/686; 257/685; 257/704; 257/723; 257/732; 257/777; 257/778; 257/796; 257/E21.001; 257/E23.18; 257/E25.013; 257/E25.006; 438/108; 438/109; 438/121

(58) Field of Classification Search
None
See application file for complete search history.

(56) References Cited

U.S. PATENT DOCUMENTS

| | | | |
|---|---|---|---|
| 6,287,892 B1 | 9/2001 | Takahashi et al. | |
| 6,740,981 B2 | 5/2004 | Hosomi | |
| 6,775,140 B2 * | 8/2004 | Shim et al. | 361/704 |
| 6,879,031 B2 * | 4/2005 | Wang | 257/686 |
| 7,078,800 B2 | 7/2006 | Kwon et al. | |
| 7,173,325 B2 | 2/2007 | Vasoya et al. | |
| 7,180,165 B2 | 2/2007 | Ellsberry et al. | |
| 2004/0150118 A1 * | 8/2004 | Honda | 257/778 |
| 2005/0006745 A1 * | 1/2005 | Nishimura | 257/686 |
| 2005/0184379 A1 * | 8/2005 | Shiozawa et al. | 257/686 |
| 2007/0141751 A1 * | 6/2007 | Mistry et al. | 438/109 |
| 2007/0181990 A1 * | 8/2007 | Huang et al. | 257/686 |
| 2007/0246811 A1 * | 10/2007 | Tsai et al. | 257/678 |
| 2008/0029858 A1 * | 2/2008 | Merilo et al. | 257/668 |
| 2008/0128881 A1 * | 6/2008 | Sekiguchi | 257/686 |
| 2008/0157328 A1 * | 7/2008 | Kawata | 257/686 |

OTHER PUBLICATIONS

Definition of stiffener. (n. d.) The American Heritage® Dictionary of the English Language, Fourth Edition. (2003). Retrieved Jun. 10, 2013 from http://www.thefreedictionary.com/stiffener.*
Definition of Unit. (n. d.) The American Heritage® Dictionary of the English Language, Fourth Edition. (2003). Retrieved Oct. 29, 2013 from http://www.thefreedictionary.com/unit.*

* cited by examiner

*Primary Examiner* — Michael Jung
(74) *Attorney, Agent, or Firm* — Ishimaru & Associates LLP

(57) ABSTRACT

A stackable integrated circuit package system including mounting an integrated circuit device over a package carrier, mounting a stiffener over the package carrier and mounting a mountable package carrier over the stiffener with a vertical gap between the integrated circuit device and the mountable package carrier.

20 Claims, 4 Drawing Sheets

US 8,779,570 B2

STACKABLE INTEGRATED CIRCUIT PACKAGE SYSTEM

TECHNICAL FIELD

The present invention relates generally to integrated circuit package systems, and more particularly to a stackable system with a stiffener.

BACKGROUND ART

Integrated circuit packaging technology has seen an increase in the number of integrated circuits mounted on a single circuit board or substrate. The new packaging designs are more compact form factors, such as the physical size and shape of a packaged integrated circuit, and providing a significant increase in overall integrated circuit density.

However, integrated circuit density continues to be limited by the "real estate" available for mounting individual integrated circuits on a substrate. Even larger form factor systems, such as personal computers (PC's), compute servers, and storage servers, need more integrated circuits in the same or smaller "real estate". The needs for portable personal electronics, such as cell phones, digital cameras, music players, personal digital assistants (PDA's), and location-based devices are particularly acute and have further driven the need for increased integrated circuit density.

This increased integrated circuit density has led to the development of multi-chip packages in which more than one integrated circuit can be packaged. For example, stackable package systems include stacked package carriers where each package carrier includes at least one integrated circuit.

However, in some cases, these dense systems may warp during manufacturing or in operation. This may result in poor yields, device failures, or reduced device lifetimes due to a variety of problems such as compromised mechanical properties or poor electrical connectivity. Contemporary electronics expose integrated circuits, integrated circuit packages, and electronic subassemblies to more demanding and sometimes harsh environmental conditions, such as cold, heat, and humidity requiring integrated circuit packages to provide robust mechanical structures. The range of operating conditions may also cause warpage resulting in failure, field returns, and increased cost.

Thus, a need still remains for a stackable integrated circuit package system that provides a low cost manufacturing, improved yield, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a stackable integrated circuit package system including mounting an integrated circuit device over a package carrier, mounting a stiffener over the package carrier and mounting a mountable package carrier over the stiffener with a vertical gap between the integrated circuit device and the mountable package carrier.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
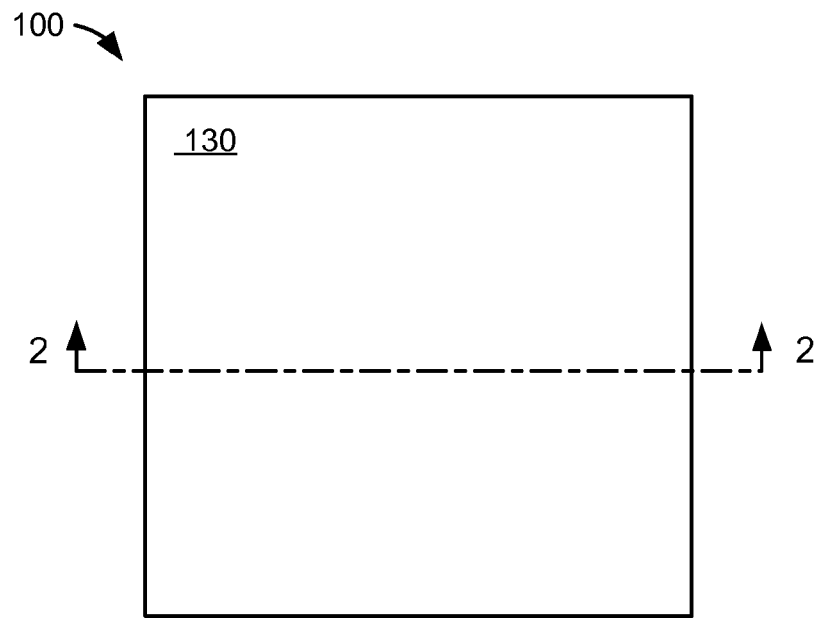
FIG. 1 is a top view of a stackable integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing figures. Generally, the invention can be operated in any orientation.

In addition, where multiple embodiments are disclosed and described having some features in common, for clarity and ease of illustration, description, and comprehension thereof, similar and like features from one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, or removal of the material or as required in forming a described structure. The term "system" as used herein means and refers to the method and to the apparatus of the present invention in accordance with the context in which the term is used.

Referring now to FIG. 1, therein is shown a top view of a stackable integrated circuit package system 100 in a first embodiment of the present invention. The top view depicts a stacking package encapsulation 130 covers the mountable package carrier (not shown). The stacking package encapsulation 130 is optional.

Figure 2:
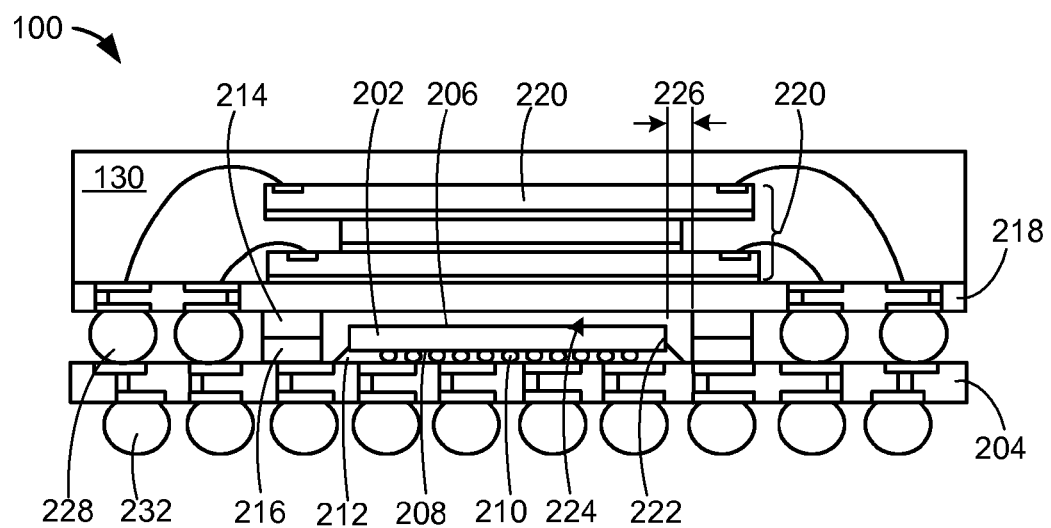
FIG. 2 is a cross-sectional view of the stackable integrated circuit package system along line 2-2 of FIG. 1.

Referring now to FIG. 2, therein is shown a cross-sectional view of the stackable integrated circuit package system 100 along line 2-2 of FIG. 1. The cross-sectional view depicts an integrated circuit device 202, such as a flip chip or a packaged integrated circuit, mounted over a package carrier 204, such as a substrate. In this example, the integrated circuit device 202 includes a top device side 206 which is non-active and a bottom device side 208 which is active, wherein the bottom device side 208 includes active circuitry fabricated thereon. Connection between the bottom device side 208 and the package carrier 204 may be established through a internal interconnect 210, such as a solder bump between the bottom device side 208 and the package carrier 204.

An underfill 212, such as a nonconductive epoxy, may fill any gaps between the integrated circuit device 202 and the package carrier 204. The underfill 212 may surround the internal interconnect 210 providing mechanical support and also function to protect the connection between the bottom device side 208 and the package carrier 204. The underfill 212 is optional.

A stiffener 214 is mounted over the package carrier 204. In this example, the stiffener 214 is a metallic material, such as copper plated nickel, and is bonded to the package carrier 204 with a bonding agent 216 such as solder or an adhesive. The stiffener 214 is thermally coupled to the package carrier 204 and a mountable package carrier 218. It is understood that the stiffener 214 may completely or partially surround the perimeter of the integrated circuit device 202. The stiffener 214 may also be of a variety of geometries, such as of a circular geometry, an oval geometry, including linear or arc shaped segments, or any combination thereof. The stiffener 214 may also be provided in a single body unit or multiple discrete units around the integrated circuit device 202.

The mountable package carrier 218, such as a substrate, is mounted over the stiffener 214. The mountable package carrier 218 can include a mountable integrated circuit device 220, such as one or more flip chips, wire bonded chips, or packaged integrated circuits. The mountable integrated circuit device 220 is optional.

According to the present invention, a vertical gap 224 is preserved between the integrated circuit device 202 and the mountable package carrier 218. However, the height of the stiffener 214 must support the preservation of the vertical gap 224. For the example illustrated in FIG. 2, the vertical gap 224 is preserved by a combination of the height of the stiffener 214 and the height of the bonding agent 216. The vertical gap 224 may provide clearance for airflow between the integrated circuit device 202 and the mountable package carrier 218 for thermal management.

A horizontal gap 226 is preserved between a sidewall 222 of the integrated circuit device 202 and the stiffener 214. The horizontal gap 226 is optional. The stiffener 214 surrounds the sidewall 222. The entire stiffener 214 is mounted outside of the vertical sidewall perimeter of the integrated circuit device 202, and is in contact with the mountable package carrier 218 outside of the vertical sidewall perimeter of the integrated circuit device 202. The vertical gap 224 between the top device side 206 and the bottom surface of the mountable package carrier 218 is free of the stiffener 214. In addition, the configuration of a thermally conductive stiffener in thermal contact with the package carrier and the mountable package carrier may improve thermal management of the system according to the present invention.

In this example, the mountable package carrier 218 is mounted over the package carrier 204 using intra-stack interconnects 228 such as solder balls. In this case, the intra-stack interconnects 228 electronically couple the package carrier 204 to the mountable package carrier 218. The package carrier 204 and the mountable package carrier 218 may include other structures (not shown), such as metal traces, metal layers, insulating layers, electrical vias, landing pads, or a combination thereof.

The stacking package encapsulation 130 is over the mountable package carrier 218 and surrounds the mountable integrated circuit device 220. External connective elements 232, such as solder balls, may optionally be provided under the package carrier 204 for further electrical connection to the next system level.

The intra-stack interconnects 228 are coupled, in a double row around the periphery of the stiffener 214, between the package carrier 204 and the mountable package carrier 218. It is understood that the number and placement of the internal interconnect 210, the intra-stack interconnects 228 and the external connective elements 232 as shown in FIG. 2 are provided for illustrative purposes, the number and placement for each may vary as needed.

For illustrative purposes, there is no material such as an encapsulant or thermally conductive material shown adjacent to the vertical gap 224 in FIG. 2. However, it is understood that in some embodiments of the present invention, materials such as encapsulants, thermally conductive materials, or any combination thereof may be applied between the integrated circuit device and the mountable package carrier without completely obstructing the vertical gap 224. In some embodiments of the present invention, the integrated circuit device 202 may be partially or completely coated with a layer of encapsulant, thermally conductive materials, or any combination thereof. Similarly, materials such as encapsulants, thermally conductive materials, or any combination thereof may be applied to the underside of the mountable package carrier 218 without completely obstructing the vertical gap 224.

For illustrative purposes, there is no material such as an encapsulant and/or thermally conductive material between the sidewall 222 of the integrated circuit device 202 and the stiffener 214 in FIG. 2. However, it is understood that in some embodiments of the present invention, other materials such as encapsulants, thermally conductive materials, or any combination thereof may be applied between the sidewall 222 of the integrated circuit device 202 and the stiffener 214. However, as previously discussed, the horizontal gap 226 is optional. Some embodiments of the present invention may not include the horizontal gap 226. Some embodiments of the present invention may include materials such as encapsulants, thermally conductive materials, or any combination thereof between the sidewall 222 of the integrated circuit device 202 and the stiffener 214, without including the horizontal gap 226. Some embodiments of the present invention may not include the horizontal gap 226 because the sidewall 222 of the integrated circuit device 202 abuts the stiffener 214.

Figure 3:
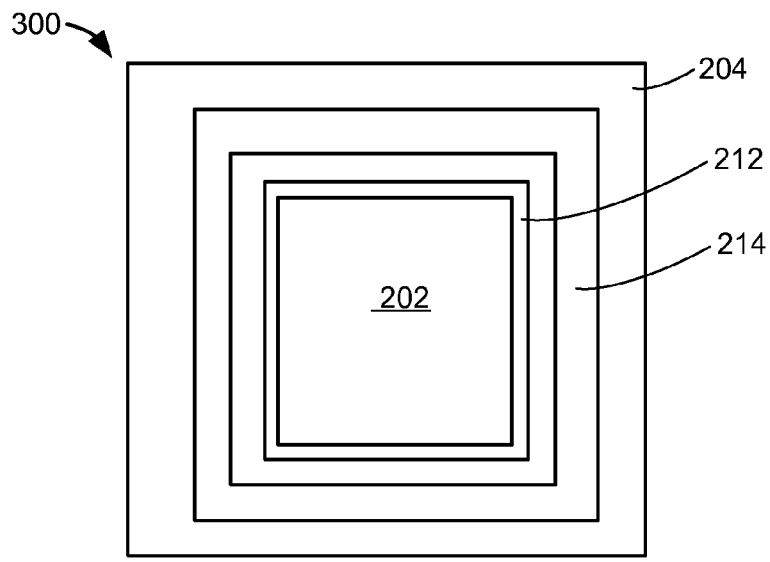
FIG. 3 is a top view of the stiffener and the integrated circuit device mounted over the package carrier alone from the first embodiment of the present invention shown in FIG. 2.

Referring now to FIG. 3, therein is shown a top view of the stiffener 214 and the integrated circuit device 202 of FIG. 2 mounted alone over the underfill 212 and the package carrier 204. In the example illustrated in FIG. 3, the stiffener 214 surrounds the perimeter of the integrated circuit device 202 and is shown as a square frame. However, it is understood that in other embodiments of the present invention, the stiffener 214 may partially surround the perimeter of the integrated circuit device 202. The stiffener 214 may also be of a variety of geometries, such as of a circular geometry, an oval geometry, including linear or arc shaped segments, or any combination thereof. The stiffener 214 may also be provided in a single body unit or multiple discrete units around the integrated circuit device 202.

It has been discovered that the present invention improves the yield and reliability of the stackable integrated circuit package system 100 by providing the stiffener 214 for additional planar rigidity. This additional planar rigidity mitigates warpage of the stackable integrated circuit package system 100 which may be caused by mismatch in the coefficient of thermal expansion (CTE) between the various materials included in the stackable integrated circuit package system 100.

Figure 4:
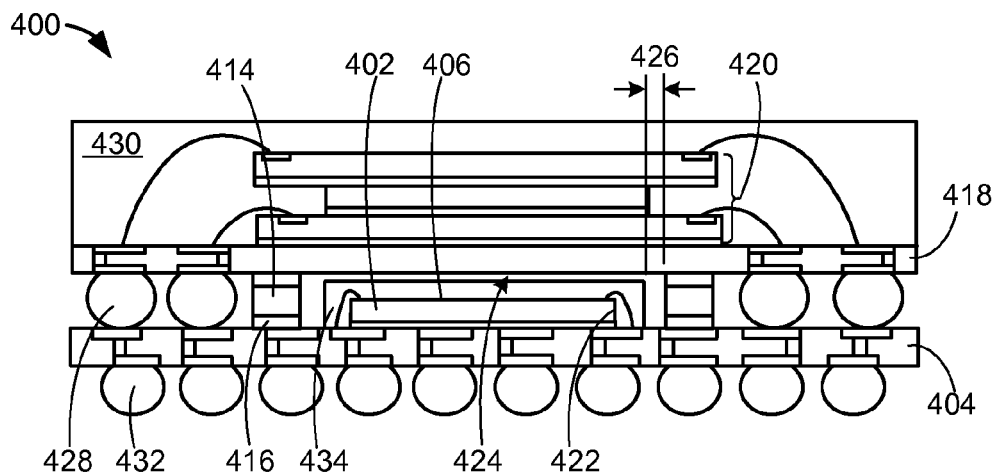
FIG. 4 is a cross-sectional view of a stackable integrated circuit package system exemplified by the top view of FIG. 1 in a second embodiment of the present invention.

Referring now to FIG. 4, therein is shown a cross-sectional view of a stackable integrated circuit package system 400 exemplified by the top view of FIG. 1 in a second embodiment of the present invention. The cross-sectional view depicts an integrated circuit device 402, such as a wire-bonded integrated circuit, mounted over a package carrier 404, such as a substrate. In this example, an inner encapsulation 434 has been applied over the package carrier 404, surrounding the integrated circuit device 402. The inner encapsulation 434 is optional.

A stiffener 414 is mounted over the package carrier 404. In this example, the stiffener 414 is a metallic material such as copper plated nickel, and is bonded to the package carrier 404 and to a mountable package carrier 418 with a bonding agent 416 such as solder or an adhesive. It is understood that the stiffener 414 may completely or partially surround the perimeter of the integrated circuit device 402. The stiffener 414 may also be of a variety of geometries, such as of a circular geometry, an oval geometry, including linear or arc shaped segments, or any combination thereof. The stiffener 414 may also be provided in a single body unit or multiple discrete units around the integrated circuit device 402.

The mountable package carrier 418 is mounted over the stiffener 414 with a vertical gap 424 between the integrated circuit device 402 and the mountable package carrier 418. In this example, the vertical gap 424 is also above the inner encapsulation 434. A horizontal gap 426 is preserved between a sidewall 422 of the inner encapsulation 434 and the stiffener 414. The horizontal gap 426 is optional. The stiffener 414 is thermally coupled to the package carrier 404 and the mountable package carrier 418. The vertical gap 424 may provide clearance for airflow between the integrated circuit device 402 and the mountable package carrier 418 for thermal management. In addition, the configuration of a thermally conductive stiffener in thermal contact with the package carrier and the mountable package carrier may improve thermal management of the system according to the present invention.

In this example, the mountable package carrier 418 is mounted over the package carrier 404 using intra-stack interconnects 428 such as solder balls. In this case, the intra-stack interconnects 428 electronically couple the package carrier 404 to the mountable package carrier 418. The package carrier 404 and the mountable package carrier 418 may include other structures (not shown), such as metal traces, metal layers, insulating layers, electrical vias, landing pads, or a combination thereof. The mountable package carrier 418 can include a mountable integrated circuit device 420, such as one or more flip chips wire bonded chips, or packaged integrated circuits. The mountable integrated circuit device 420 is optional.

A stacking package encapsulation 430 covers the mountable package carrier 418 and surrounds the mountable integrated circuit device 420. External connective elements 432, such as solder balls, may be provided under the package carrier 404 for further electrical connection to the next system level. The external connective elements 432 are optional.

It has been discovered that the present invention improves the yield and reliability of the stackable integrated circuit package system 400 by providing the stiffener 414 for additional planar rigidity. This additional planar rigidity mitigates warpage of the stackable integrated circuit package system 400 which may be caused by mismatch in the coefficient of thermal expansion (CTE) between the various materials included in the stackable integrated circuit package system 400.

In the example illustrated in FIG. 4, the stiffener 414 surrounds the perimeter of the integrated circuit device 402. However, it is understood that in other embodiments of the present invention, the stiffener may not fully surround the perimeter of the integrated circuit device. As previously discussed, according to the present invention, a variety of stiffener geometries are possible such as, square stiffener, a rectangular stiffener, a circular stiffener, an oval stiffener or a stiffener including linear or arc shaped segments. The stiffener can include multiple segments which do not necessarily touch each other. However, the height of the stiffener must support the preservation of the vertical gap 424. For the example illustrated in FIG. 4, the vertical gap 424 is preserved by a combination of the height of the stiffener 414 and the height of the bonding agents 416.

The intra-stack interconnects 428 are coupled, in a double row around the periphery of the stiffener 414, between the package carrier 404 and the mountable package carrier 418. It is understood that the number and placement of the intra-stack interconnects 428 and the external connective elements 432 as shown in FIG. 4 are provided for illustrative purposes, the number and placement for each may vary as needed.

For illustrative purposes, the inner encapsulation 434 has been applied over the package carrier 404 and surrounds the integrated circuit device 402. However, it is understood that in some embodiments of the present invention, there is no material such as an encapsulant and/or thermally conductive material between the integrated circuit device 402 and the mountable package carrier 418. In some embodiments of the present invention, the inner encapsulation 434 may not coat a top device side 406 of the integrated circuit device 402, exposing some or all of the top device side 406 of the integrated circuit device 402. Furthermore, it is understood that in some embodiments of the present invention, other materials such as thermally conductive materials may be applied in addition to or instead of the inner encapsulation 434 without completely obstructing the vertical gap 424. Similarly, materials such as encapsulants and/or thermally conductive materials can be applied to the underside of the mountable package carrier 418 without completely obstructing the vertical gap 424.

For illustrative purposes, the inner encapsulation 434 has been applied between the sidewall 422 of the integrated circuit device 402 and the stiffener 414 in FIG. 4. However, it is understood that in some embodiments of the present invention, additional materials such as encapsulants and/or thermally conductive materials may be applied between the nonhorizontal edge of the inner encapsulation 434 and the stiffener 414. However, as previously discussed, the horizontal gap 426 is optional. Some embodiments of the present invention may not include the horizontal gap 426. Some embodiments of the present invention may include materials such as encapsulants and/or thermally conductive materials between the sidewall 422 of the integrated circuit device 402 and the stiffener 414, without including the horizontal gap 426. Some embodiments of the present invention may not include the horizontal gap 426; in some cases, this may be because the sidewall 422 of the integrated circuit device 402 abuts the stiffener 414.

It has been discovered that the present invention improves the yield and reliability of the stackable integrated circuit package system 400 by providing the stiffener 414 for additional planar rigidity. This additional planar rigidity mitigates warpage of the stackable integrated circuit package system 400 which may be caused by mismatch in the coefficient of thermal expansion (CTE) between the various materials included in the stackable integrated circuit package system 400.

Figure 5:
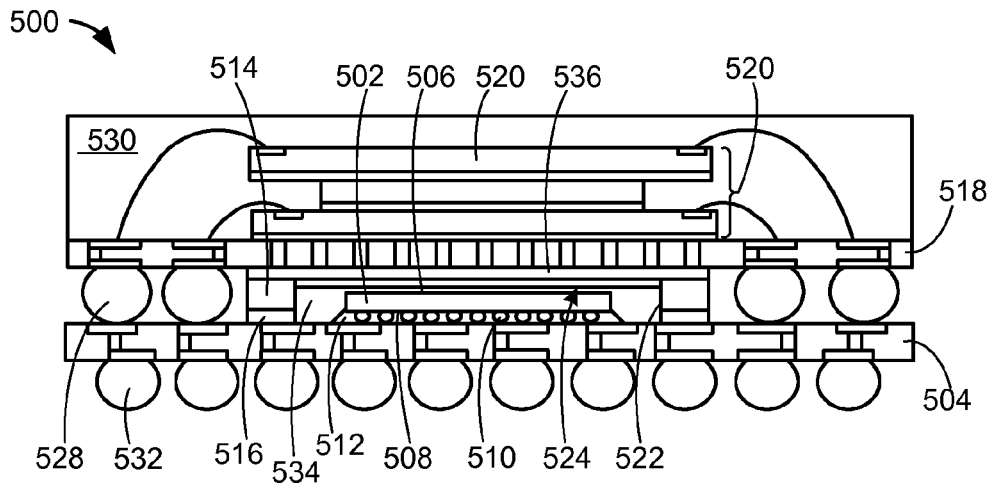
FIG. 5 is a cross-sectional view of a stackable integrated circuit package system exemplified by the top view of FIG. 1 in a third embodiment of the present invention.

Referring now to FIG. 5, therein is shown a cross-sectional view of a stackable integrated circuit package system 500 exemplified by the top view of FIG. 1 in a third embodiment of the present invention. The cross-sectional view depicts an integrated circuit device 502, such as a flip chip or a packaged integrated circuit, mounted over a package carrier 504, such as a substrate. In this example, the integrated circuit device 502 includes a top device side 506 which is non-active and a bottom device side 508 which is active, wherein the bottom device side 508 includes active circuitry fabricated thereon. Connection between the bottom device side 508 and the package carrier 504 may be established through a internal interconnect 510, such as a solder bump between the bottom device side 508 and the package carrier 504.

An underfill 512, such as a nonconductive epoxy, may fill any gaps between the integrated circuit device 502 and the package carrier 504. The underfill 512 may surround the internal interconnect 510 providing mechanical support and also function to protect the connection between the bottom device side 508 and the package carrier 504. The underfill is optional.

A stiffener 514 is mounted over the package carrier 504. In this example, the stiffener 514 is a metallic material such as copper plated nickel, and is bonded to the package carrier 504 with a bonding agent 516 such as solder or an adhesive. It is understood that the stiffener 514 may completely or partially surround the perimeter of the integrated circuit device 502. The stiffener 514 may also be of a variety of geometries, such as of a circular geometry, an oval geometry, including linear or arc shaped segments, or any combination thereof. The stiffener 514 may also be provided in a single body unit or multiple discrete units around the integrated circuit device 502.

In this example, an inner encapsulation 534 has been applied over the package carrier 504, surrounding the integrated circuit device 502. The inner encapsulation 534 is optional. In this embodiment, no horizontal gap is preserved between a sidewall 522 of the integrated circuit device 502 and the stiffener 514.

A lid 536 is attached over the stiffener 514 and over the integrated circuit device 502. For example, the lid 536 may include thermally conductive materials, such as metallic materials. In some cases, this may improve the thermal properties of the stackable integrated circuit package system 500. In some cases, the lid 536 may include rigid materials and provide additional rigidity to the stackable integrated circuit package system 500. In some cases, the lid 536 may include polymer materials. The lid 536 is optional.

A mountable package carrier 518 is mounted over the lid 536. A vertical gap 524 is preserved between the integrated circuit device 502 and the mountable package carrier 518. In this example, the vertical gap 524 is also above the inner encapsulation 534 and below the lid 536. It is understood that in other embodiments of the present invention, more than one vertical gap may exist.

According to the present invention, the height of the stiffener 514 must support the preservation of the vertical gap 524. For the example illustrated in FIG. 5, the vertical gap 524 is preserved by a combination of the height of the stiffener 514, the height of the bonding agent 516 and the thickness of the lid 536.

In this example, the stiffener 514 and the lid 536 are thermally coupled to the package carrier 504 and the mountable package carrier 518. The vertical gap 524 may provide clearance for airflow between the integrated circuit device 502 and the mountable package carrier 518 for thermal management. In addition, the configuration of a thermally conductive stiffener in thermal contact with the package carrier 504, a thermally conductive lid in thermal contact with the stiffener 514 and the mountable package carrier 518 may improve thermal management of the system according to the present invention.

For illustrative purposes, the lid 536 is shown in direct contact with the mountable package carrier 518. However, in other examples according to the present invention, a layer of material such as a thermally conductive material may be applied between the lid 536 and the mountable package carrier 518.

In this example, the mountable package carrier 518 is mounted over the package carrier 504 using intra-stack interconnects 528 such as solder balls. In this case, the intra-stack interconnects 528 electronically couple the package carrier 504 to the mountable package carrier 518. The package carrier 504 and the mountable package carrier 518 may include other structures (not shown), such as metal traces, metal layers, insulating layers, electrical vias, landing pads, or a combination thereof. The mountable package carrier 518 can include a mountable integrated circuit device 520, such as one or more flip chips, wire bonded chips, or packaged integrated circuits. The mountable integrated circuit device 520 is optional.

A stacking package encapsulation 530 covers the mountable package carrier 518 and surrounds the mountable integrated circuit device 520. External connective elements 532, such as solder balls, are provided under the package carrier 504 for further electrical connection to the next system level. The external connective elements 532 are optional.

The intra-stack interconnects 528 are coupled, in a double row around the periphery of the stiffener 514, between the package carrier 504 and the mountable package carrier 518. It is understood that the number and placement of the intra-stack interconnects 528 of FIG. 5 and the external connective elements 532 as shown in FIG. 5 are provided for illustrative purposes, the number and placement for each may vary as needed.

For illustrative purposes, the inner encapsulation 534 has been applied over the mountable package carrier 518 and surrounds the mountable integrated circuit device 520. However, it is understood that in some embodiments of the present invention, there is no material such as an encapsulant and/or thermally conductive material between the integrated circuit device 502 and the mountable package carrier 518. In some embodiments of the present invention, the inner encapsulation 534 may not coat the top device side 506 of the integrated circuit device 502, exposing some or all of the top device side 506 of the integrated circuit device 502. Furthermore, it is understood that in some embodiments of the present invention, other materials such as thermally conductive materials may be applied in addition to or instead of the inner encapsulation 534 without completely obstructing the vertical gap 524. Similarly, materials such as encapsulants and/or thermally conductive materials can be applied to the underside of the mountable package carrier 518 without completely obstructing the vertical gap 524.

Figure 6A:
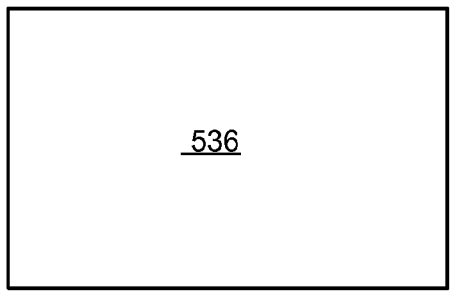
FIG. 6A is a top view of a lid, alone from the third embodiment of the present invention.

FIG. 6A is a top view of the lid 536 alone from FIG. 5. In this example, the lid 536 is a solid rectangular layer of material. However it is understood that in some embodiments of the present invention, the shape of the lid 536 may vary in geometric shape as needed. Furthermore, in some embodiments of the present invention, the lid 536 can be perforated.

Figure 6B:
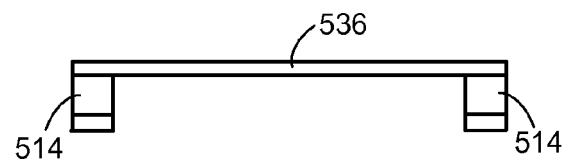
FIG. 6B is a side view of a lid and stiffener alone from a third embodiment of the present invention.

FIG. 6B is a side view of the lid 536 and the stiffener 514 alone from FIG. 5. In this example, the stiffener 514 includes two strips of material. The strips are positioned on opposite sides of the integrated circuit device 502 of FIG. 5 and are substantially parallel to each other. In the embodiment of the present invention, the height of the stiffener 514 must support the preservation of the vertical gap 524 of FIG. 5. The lid 536 is attached to each of the strips.

For the purposes of illustration, the lid 536 and the stiffener 514 illustrated in FIG. 5, FIG. 6A and FIG. 6B are shown as two separate elements. However, it is understood that in some embodiments of the present invention, the lid 536 and the stiffener 514 may be part of the same element, such as a stiffener with an integrated lid. For example, a stiffener with an integrated lid may be formed as a single element or prefabricated from two or more parts before being included into various embodiments of the present invention.

Figure 7:
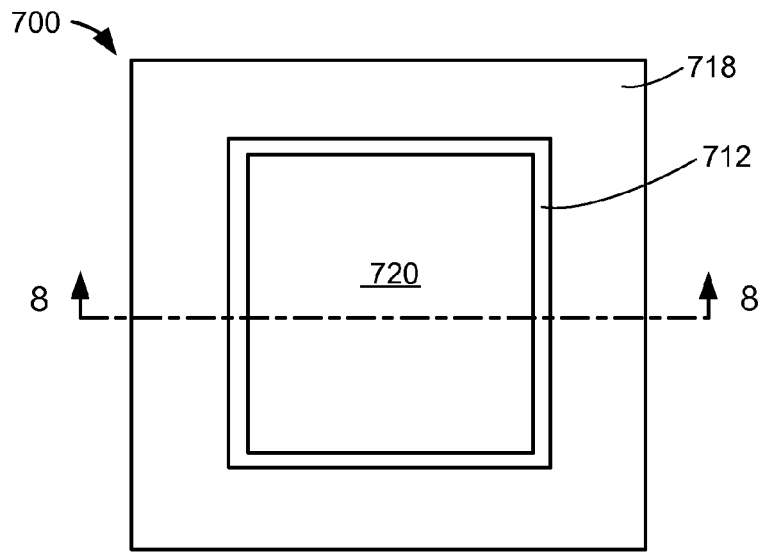
FIG. 7 is a top view of a stackable integrated circuit package system in a fourth embodiment of the present invention.

Referring now to FIG. 7, therein is shown a top view of a stackable integrated circuit package system 700 in a fourth embodiment of the present invention. FIG. 7 depicts a mountable package carrier 718, such as a substrate. Mountable package carrier 718 can include a mountable integrated circuit device 720, such as one or more flip chips, wire bonded chips, or packaged integrated circuits mounted on the mountable package carrier 718. The mountable integrated circuit device 720 is optional. A mountable integrated circuit device underfill 712, such as a nonconductive epoxy, may fill any gaps between the mountable integrated circuit device 720 and the mountable package carrier 718.

Figure 8:
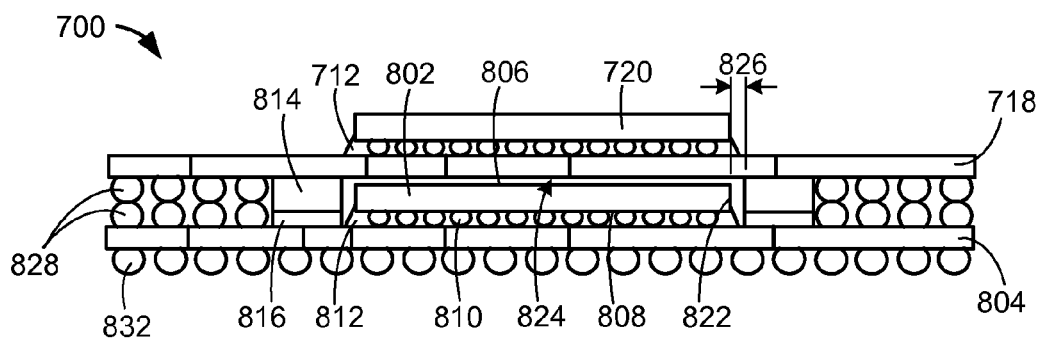
FIG. 8 is a cross-sectional view of the integrated circuit package system along line 8-8 of FIG. 7.

Referring now to FIG. 8, therein is shown a cross-sectional view of the stackable integrated circuit package system 700 along line 8-8 of FIG. 7. The cross-sectional view depicts an integrated circuit device 802, such as a flip chip or a packaged integrated circuit, mounted over a package carrier 804, such as a substrate. In this example, the integrated circuit device 802 includes a top device side 806 which is non-active and a bottom device side 808 which is active, wherein the bottom device side 808 includes active circuitry fabricated thereon. Connection between the bottom device side 808 and the package carrier 804 may be established through a internal interconnect 810, such as a solder bump between the bottom device side 808 and the package carrier 804.

An underfill 812, such as a nonconductive epoxy, may fill any gaps between the integrated circuit device 802 and the package carrier 804. The underfill 812 may surround the internal interconnect 810 providing mechanical support and also function to protect the connection between the bottom device side 808 and the package carrier 804. The underfill is optional.

A stiffener 814 is mounted over the package carrier 804. In this example, the stiffener 814 is a metallic material such as copper plated nickel, and is bonded to the package carrier 804 with a bonding agent 816 such as solder or an adhesive. It is understood that the stiffener 814 may completely or partially surround the perimeter of the integrated circuit device 802. The stiffener 814 may also be of a variety of geometries, such as of a circular geometry, an oval geometry, including linear or arc shaped segments, or any combination thereof. The stiffener 814 may also be provided in a single body unit or multiple discrete units around the integrated circuit device 802.

The mountable package carrier 718 is mounted over the stiffener 814 preserving a vertical gap 824 between the integrated circuit device 802 and the mountable package carrier 718. A horizontal gap 826 may be optionally preserved between a sidewall 822 of the integrated circuit device 802 and the stiffener 814. In this example, the horizontal gap 826 does not have a constant width. The stiffener 814 is thermally coupled to the package carrier 804 and the mountable package carrier 718. The vertical gap 824 may provide clearance for airflow between the integrated circuit device 802 and the mountable package carrier 718 for thermal management. In addition, the configuration of a thermally conductive stiffener in thermal contact with the package carrier and the mountable package carrier may improve thermal management of the system according to the present invention.

In this example, the mountable package carrier 718 is mounted over the package carrier 804 using intra-stack interconnects 828 such as solder balls. For the example illustrated in FIG. 8, the intra-stack interconnects include two layers of solder balls for improved electrical contact and reliability. The intra-stack interconnects 828 electronically couple the package carrier 804 to the mountable package carrier 718. The package carrier 804 and the mountable package carrier 718 may include other structures (not shown), such as metal traces, metal layers, insulating layers, electrical vias, landing pads, or a combination thereof. FIG. 8 depicts the mountable integrated circuit device 720 mounted on the mountable package carrier 718. No encapsulation has been applied over the mountable package carrier 718.

External connective elements 832, such as solder balls, are provided under the package carrier 804 for further electrical connection to the next system level. The external connective elements 832 are optional.

In the example illustrated in FIG. 8, the stiffener 814 partially surrounds the perimeter of the integrated circuit device 802. However, it is understood that in other embodiments of the present invention, the stiffener may fully surround the perimeter of the integrated circuit device. As previously discussed, according to the present invention, a variety of stiffener geometries are possible such as, square stiffener, a rectangular stiffener, a circular stiffener, an oval stiffener or a stiffener including linear or arc shaped segments. The stiffener can include multiple segments which do not necessarily touch each other. However, the height of the stiffener must support the preservation of the vertical gap. For the example illustrated in FIG. 8, the vertical gap 824 is preserved by a combination of the height of the stiffener 814 and the height of the bonding agent 816.

The intra-stack interconnects 828 are coupled, in a double row around the periphery of the stiffener 814, between the package carrier 804 and the mountable package carrier 818. It is understood that the number and placement of the internal interconnect 810, the intra-stack interconnects 828 and the external connective elements 832 as shown in FIG. 8 are provided for illustrative purposes, the number and placement for each may vary as needed.

For illustrative purposes, there is no material such as an encapsulant and/or thermally conductive material between the integrated circuit device 802 and the mountable package carrier 718 in FIG. 8. However, it is understood that in some embodiments of the present invention, other materials such as encapsulants and/or thermally conductive materials may be applied between the integrated circuit device 802 and the mountable package carrier 718 without completely obstructing the vertical gap 824. For example, in some embodiments of the present invention, the integrated circuit device 802 may be partially or completely coated with a layer of encapsulant and/or thermally conductive materials. Similarly, materials such as encapsulants and/or thermally conductive materials may be applied to the underside of the mountable package carrier 718 without completely obstructing the vertical gap 824.

For illustrative purposes, there is no material such as an encapsulant and/or thermally conductive material between the sidewall 822 of the integrated circuit device 802 and the stiffener 814 in FIG. 8. However, it is understood that in some embodiments of the present invention, other materials such as encapsulants and/or thermally conductive materials may be applied between the sidewall 822 of the integrated circuit device 802 and the stiffener 814. However, as previously discussed, the horizontal gap 826 is optional. Some embodiments of the present invention may not include the horizontal gap 826. Some embodiments of the present invention may include materials such as encapsulants and/or thermally conductive materials between the sidewall 822 of the integrated circuit device 802 and the stiffener 814, without including the horizontal gap 826. Some embodiments of the present invention may not include the horizontal gap 826; in some cases, this may be because the sidewall 822 of the integrated circuit device 802 abuts the stiffener 814.

It has been discovered that the present invention provides the stackable integrated circuit package system 700 having improved reliability and manufacturing yields. The configuration of stiffener and the vertical gap results in improved thermal behavior and reduced warpage of the stackable integrated circuit package system 700. The inclusion of the optional lid, configured to preserve the vertical gap, may provide additional improvements for some systems.

Yet another important aspect of the present invention is that it valuably supports and services the historical trend of reducing costs, simplifying systems, and increasing performance.

These and other valuable aspects of the present invention consequently further the state of the technology to at least the next level.

Figure 9:
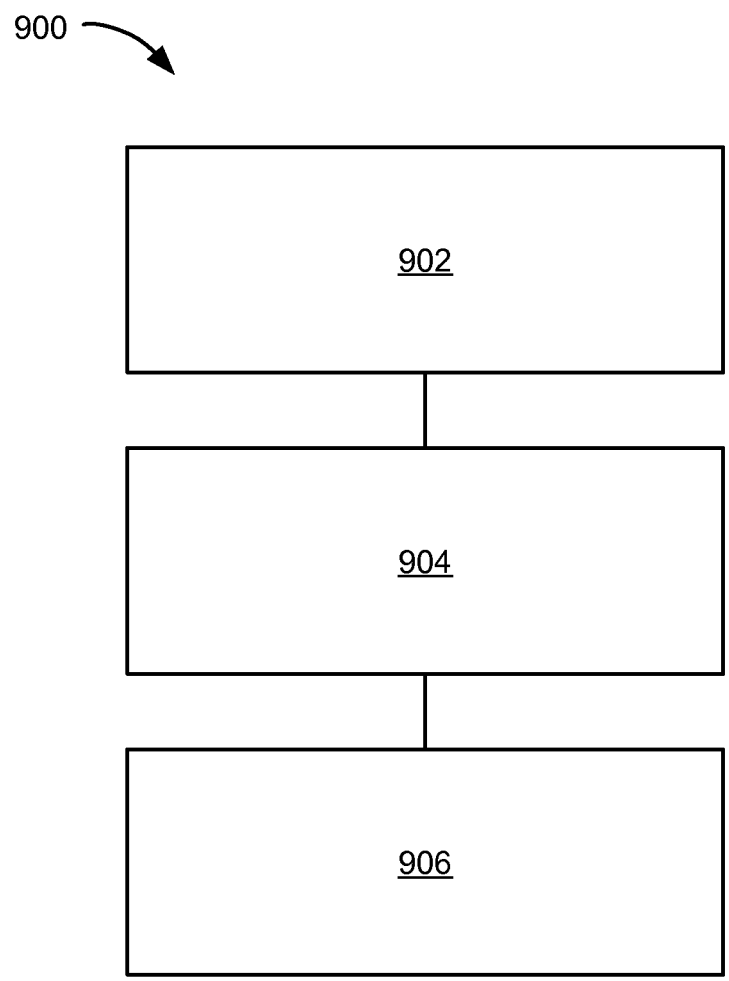
FIG. 9 is a flow chart of an integrated circuit package system for manufacturing a stackable integrated circuit package system in an embodiment of the present invention.

Referring now to FIG. 9, therein is shown a flow chart of a stackable integrated circuit package system 900 for manufacturing the stackable integrated circuit package system 100 in an embodiment of the present invention. The system 900 comprises mounting an integrated circuit device over a package carrier in a block 902; mounting a stiffener over the package carrier in a block 904; and mounting a mountable package carrier over the stiffener with a vertical gap between the integrated circuit device and the mountable package carrier in a block 906.

Thus, it has been discovered that the mountable integrated circuit package system of the present invention furnishes important and heretofore unknown and unavailable solutions, capabilities, and functional aspects for improving yield, increasing reliability, and reducing cost of circuit system.

The resulting processes and configurations are straightforward, cost-effective, uncomplicated, highly versatile, and effective, can be surprisingly and unobviously implemented by adapting known technologies, and are thus readily suited for efficiently and economically manufacturing integrated circuit package systems that are fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. A stackable integrated circuit package system comprising:
    an integrated circuit device mounted over a package carrier;
    a stiffener mounted over the package carrier, the stiffener is a metallic single body unit continuously surrounding a perimeter of the integrated circuit device;
    a mountable package carrier mounted on the stiffener includes a vertical gap between the integrated circuit device and the mountable package carrier, wherein the stiffener is in contact with the mountable package carrier outside of a vertical sidewall perimeter of the integrated circuit device; and
    intra-stack interconnects coupled, in a double row around the stiffener, between the package carrier and the mountable package carrier.

2. The system as claimed in claim 1 including a horizontal gap between a sidewall of the integrated circuit device and the stiffener.

3. The system as claimed in claim 1 further comprising a lid over the stiffener and over the integrated circuit device.

4. The system as claimed in claim 1 further comprising an underfill between the integrated circuit device and the package carrier.

5. The system as claimed in claim 1 further comprising an inner encapsulation over the package carrier.

6. The system as claimed in claim 1 wherein the double row is between the periphery of the stiffener and an edge of the package carrier.

7. The system as claimed in claim 6 wherein the stiffener includes an integrated lid mounted over the integrated circuit device.

8. The system as claimed in claim 6 further comprising a lid, over the stiffener, includes metallic material.

9. The system as claimed in claim 6 wherein the stiffener is attached to the package carrier with a bonding agent.

10. The system as claimed in claim 6 wherein the stiffener includes linear shaped segments.

11. A method of manufacturing a stackable integrated circuit package system comprising:
    mounting an integrated circuit device over a package carrier;
    mounting a stiffener over the package carrier, the stiffener is a metallic single body unit continuously surrounding a perimeter of the integrated circuit device;
    mounting a mountable package carrier on the stiffener includes preserving a vertical gap between the integrated circuit device and the mountable package carrier, wherein the stiffener is in contact with the mountable package carrier outside of a vertical sidewall perimeter of the integrated circuit device; and
    coupling intra-stack interconnects, in a double row around the stiffener, between the package carrier and the mountable package carrier.

12. The method as claimed in claim 11 wherein mounting the stiffener over the package carrier includes forming a horizontal gap between a sidewall of the integrated circuit device and the stiffener.

13. The method as claimed in claim 11 further comprising attaching a lid over the stiffener and over the integrated circuit device.

14. The method as claimed in claim 11 further comprising forming an underfill between the integrated circuit device and the package carrier.

15. The method as claimed in claim 11 wherein mounting the integrated circuit device includes mounting the integrated circuit device having an inner encapsulation over the package carrier.

16. A method of manufacturing a stackable integrated circuit package system comprising:
    mounting an integrated circuit device over a package carrier;
    mounting a stiffener over the package career, the stiffener is a metallic single body unit continuously surrounding a perimeter of the integrated circuit device;
    mounting a mountable package carrier on the stiffener includes positioning a mountable integrated circuit device for preserving a vertical gap between the integrated circuit device and the mountable package carrier, wherein the stiffener is in contact with the mountable package carrier outside of a vertical sidewall perimeter of the integrated circuit device; and
    coupling intra-stack interconnects, in at least a double row around the stiffener, between the package carrier and the mountable package carrier wherein the double row is between the periphery of the stiffener and the edge of the package carrier.

17. The method as claimed in claim 16 further comprising attaching a lid over the stiffener and over the integrated circuit device.

18. The method as claimed in claim 16 wherein mounting the stiffener over the package carrier includes mounting an integrated lid of the stiffener over the integrated circuit device.

19. The method as claimed in claim 16 wherein mounting the stiffener over the package carrier includes attaching the stiffener to the package carrier with a bonding agent.

20. The method as claimed in claim 16 wherein mounting the stiffener over the package carrier includes mounting the stiffener having linear shaped segments.

\* \* \* \* \*

UNITED STATES PATENT AND TRADEMARK OFFICE
CERTIFICATE OF CORRECTION

PATENT NO.         : 8,779,570 B2  
APPLICATION NO.    : 12/051469  
DATED              : July 15, 2014  
INVENTOR(S)        : Shim et al.

Page 1 of 1

It is certified that error appears in the above-identified patent and that said Letters Patent is hereby corrected as shown below:

In the Claims:

Column 13, Claim 16, line 19, delete "career" and insert therefor --carrier--

Signed and Sealed this
Twenty-second Day of March, 2016

Michelle K. Lee
*Director of the United States Patent and Trademark Office*